(12) United States Patent
Yu et al.

(10) Patent No.: US 7,755,950 B2
(45) Date of Patent: Jul. 13, 2010

(54) PROGRAMMING METHODS OF MEMORY SYSTEMS HAVING A MULTILEVEL CELL FLASH MEMORY

(75) Inventors: Jae-Sung Yu, Seoul (KR); Jin-Hyeok Choi, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 623 days.

(21) Appl. No.: 11/796,978

(22) Filed: Apr. 30, 2007

(65) Prior Publication Data

US 2008/0177934 A1    Jul. 24, 2008

(30) Foreign Application Priority Data

Jan. 24, 2007    (KR)    ...................... 10-2007-0007527

(51) Int. Cl.
*G11C 11/34*    (2006.01)
*G11C 16/04*    (2006.01)

(52) U.S. Cl. ............................. 365/185.28; 365/185.05; 365/185.11

(58) Field of Classification Search ............ 365/185.03, 365/185.28, 185.11
See application file for complete search history.

(56) References Cited

U.S. PATENT DOCUMENTS

| | | | |
|---|---|---|---|
| 6,766,325 | B1 | 7/2004 | Pasumansky et al. |
| 6,999,970 | B2 | 2/2006 | Pasumansky et al. |
| 7,016,912 | B2 | 3/2006 | Pasumansky et al. |
| 2005/0213393 | A1 | 9/2005 | Lasser |
| 2006/0101207 | A1* | 5/2006 | Nakazato ..................... 711/131 |
| 2006/0155919 | A1 | 7/2006 | Lasser et al. |
| 2006/0198217 | A1 | 9/2006 | Roohparvar |
| 2007/0150693 | A1 | 6/2007 | Kaneko et al. |
| 2008/0313371 | A1* | 12/2008 | Kedem et al. ................. 710/68 |

* cited by examiner

*Primary Examiner*—Ly D Pham
(74) *Attorney, Agent, or Firm*—Myers Bigel Sibley & Sajovec, P.A.

(57) ABSTRACT

A method of programming a multilevel cell flash memory includes dividing a memory cell array of the flash memory into a user block and a cache block, programming first LSB data into a page of the user block, programming first MSB data into the page of the user block after programming the first LSB data, programming second LSB data into a page of the cache block, and storing control data for controlling the flash memory in the cache block.

14 Claims, 7 Drawing Sheets

PROGRAMMING METHODS OF MEMORY SYSTEMS HAVING A MULTILEVEL CELL FLASH MEMORY

CROSS-REFERENCE TO RELATED APPLICATION

This U.S. non-provisional patent application claims priority under 35 U.S.C. §119 to Korean Patent Application No. 2007-07527 filed on Jan. 24, 2007, the entire contents of which are hereby incorporated herein by reference.

BACKGROUND

The present invention disclosed herein relates to memory systems and, more particularly, to memory systems having a multilevel cell flash memory and programming methods thereof.

Portable apparatus that use nonvolatile memories are increasingly used today. Nonvolatile memories may be embedded as storage units in MP3 players, digital cameras, mobile phones, camcorders, flash cards, solid state disks (SSDs), and so on.

Increasing with apparatus that use nonvolatile memories as storage units, memory capacities thereof are increasing rapidly. One of the ways for increasing the memory capacity is a multi-level cell (MLC) mode that stores multiple bits in a unit memory cell.

FIG. 1 is a block diagram of a conventional memory system. Referring to FIG. 1, the memory system 100 includes a host 110, a memory controller 120, and a flash memory 130.

The memory controller 120 includes a buffer memory 121. The flash memory 130 includes a cell array 131 and a page buffer 132. Although not shown in FIG. 1, the flash memory 130 also includes a decoder, a data buffer, and a control unit.

The memory controller 120 receives data and a write command from the host 110, and controls the flash memory 130 to write the received data into the cell array 131. Further, the memory controller 120 operates to control the flash memory 130 to read data from the cell array 131 in compliance with a read command provided from the host 110.

The buffer memory 121 temporarily stores data to be written into or read from the flash memory 130. The buffer memory 121 transfers data, which are stored therein provisionally by the memory controller 120, to the host 110 or the flash memory 130.

The cell array 131 of the flash memory 130 is composed of a plurality of memory cells. These memory cells are nonvolatile, retaining their data even without power after storing the data. The page buffer 132 is provided to store data to be written into or data read from a selected page.

A memory cell of the flash memory 130 is classified into a single-level cell (SLC) type and a multi-level cell (MLC) type in accordance with the number of data bits able to be stored. The SLC stores single-bit data, while the MLC stores multi-bit data.

First, the memory considers an SLC mode in which a unit cell stores a single data bit. The SLC is operable in two states according to a distribution of threshold voltages. This SLC stores data '1' or '0' after a programming operation. Here, a memory cell storing data '1' is referred to as being conditioned in an erased state, while a memory cell storing data '0' is referred to as being conditioned in a programmed state. A memory cell of the erased state is called an 'on-cell', while a memory cell of the programmed state is called an 'off-cell'.

The flash memory 130 conducts a programming operation in the unit of page. The memory controller 120 transfers data to the flash memory 130 through the buffer memory 121 in the unit of page during a programming operation.

The page buffer 132 temporarily stores data loaded from the buffer memory 121, and programs the loaded data into a selected page at the same time. After completing the programming operation, a program-verifying operation is carried out for verifying whether the data have been correctly programmed.

From a result of the program-verifying operation, if there is a program fail, program-verifying operations are repeated while incrementing a program voltage. After completely programming data corresponding to one page, the next data are received for the next programming operation.

Next, the memory considers an MLC mode in which a unit cell stores multi-bit data. FIG. 2 shows a conventional procedure of programming 2-bit data, i.e., a least significant bit (LB) and a not significant bit (MSB), into a single memory cell.

Referring to FIG. 2, a memory cell is programmed to have one of four states 11, 01, 10, and 00 in accordance with a distribution of threshold voltages. A procedure of programming an LSB is the same as that of the aforementioned SLC mode. A memory cell conditioned in the '11' state is programmed to have a state A depicted by a dotted line in accordance with an LSB.

Then, the memory controller 120 transfers page data (data corresponding to one page) to the flash memory 130 from the buffer memory 121 to program an MSB. Referring to FIG. 2, a memory cell conditioned according to the dotted curve A is programmed to have the '00' state (program1) or the '10' state (program2). Meanwhile, a memory cell programmed to the '11' state is maintained in the '11' state or programmed to the '01' state (program3) in accordance with an MSB.

Returning to FIG. 1, the memory system 100 programs multi-bit data into the cell array 131 of the flash memory 130 by way of the aforementioned procedure. Namely, multi-bit data are programmed by the successive steps of first programming an LSB and then programming an MSB into the memory cell that has been programmed with the LSB.

However, there is a probability of failure while programming an MSB into a memory cell that has been programmed with an LSB. If there is an error while programming an MSB, it would effect a change of the LSB already programmed.

As an MSB is stored in the buffer memory 121 of the memory controller 120 until completing a program-verifying operation, data may be restored although it is damaged. Because an LSB is not maintained in the buffer memory 121, there is no way of restoring the LSB. Thus, such a conventional memory system may lose its LSB inadvertently while programming multi-bit data.

SUMMARY

According to some embodiments of the present invention, a method of programming a multilevel cell flash memory includes dividing a memory cell array of the flash memory into a user block and a cache block, programming first LSB data into a page of the user block, programming first MSB data into the page of the user block after programming the first LSB data, programming second LSB data into a page of the cache block, and storing control data for controlling the flash memory in the cache block.

In other embodiments, the method further comprises backing up the first LSB data before programming the first MSB data.

In still other embodiments, the method further comprises detecting a program fail from the page of the user block after programming the first MSB data.

In still other embodiments, the method further comprises reprogramming the first LSB data and the second MSB data into a new page of the user block responsive to detecting the program fail.

In still other embodiments, the method further comprises detecting a program fail from the page of the cache block after programming the second LSB data.

In still other embodiments, the method further comprises reprogramming the second LSB data into a new page of the cache block responsive to detecting the program fail.

In still other embodiments, the cache block stores high use-frequency data among data stored in the user block.

In still other embodiments, the method further comprises detecting a program fail from the page of the user block after programming the first MSB data.

In still other embodiments, the method further comprises repairing the first LSB data responsive to detecting the program fail.

In still other embodiments, repairing the first LSB data comprises reading the first LSB data from the page of the user block, determining whether the first LSB data is correctable by an error correction code, and reprogramming the first LSB data and the first MSB data into a new page of the user block responsive to determining that the first LSB data is correctable by the error correction code.

In still other embodiments, the method further comprises detecting a fail position based on the first MSB data if the first LSB data is not correctable using the error correction code.

In still other embodiments, the method further comprises correcting the repaired first LSB data using the error correction code.

In still other embodiments, the method further comprises reprogramming the corrected first LSB data and the first MSB data into the new page of the user block.

In still other embodiments, the flash memory is a NAND flash memory.

In further embodiments of the present invention, a memory system includes a host, a multi-bit cell flash memory including a memory cell array having a user block and a cache block, and a memory controller operative to control the multi-bit cell flash memory in response to a command input from the host, wherein the user block is programmed with first MSB data after being programmed with first LSB data, and wherein the cache block is programmed with second LSB data and stores data for controlling the multi-bit cell flash memory.

In still further embodiments, the memory system is configured to reserve the first LSB data while programming the user block.

In still further embodiments, the memory controller comprises a backup memory that is configured to reserve the first LSB data programmed in the user block.

In still further embodiments, the memory controller further comprises a buffer memory that is configured to temporarily store the first LSB data and second MSB data to be programmed into the user block.

In still further embodiments, the memory controller is configured to store the programmed first LSB data in the backup memory before programming the first MSB data into the user block.

In still further embodiments, the memory controller is configured to detect a program fail after programming the user block with the first MSB data stored in the buffer memory.

In still further embodiments, the memory controller is configured to reprogram the user block with the first LSB data, which is stored in the backup memory, and the first MSB data stored in the buffer memory responsive to detection of the program fail.

In still further embodiments, the cache block is configured to store high use-frequency data of the user block.

In still further embodiments, the memory controller comprises a buffer memory that is configured to store the first MSB data, a backup memory that is configured to reserve the first LSB data stored in the user block if there is a program fail while programming the first MSB data into the user block, and an error correction code that is configured to correct an error of the first LSB data read from the backup memory and to output the corrected first LSB data to the backup memory, wherein the memory controller is configured to reprogram the user block with the corrected first LSB data of the backup memory and the first MSB data of the buffer memory.

In still further embodiments, the memory controller further comprises a comparator that is configured to compare the first MSB data, which is stored in the buffer memory, with the first MSB data stored in the user block responsive to a determination that the first LSB data is not correctable using the error correction code, a fail position detector that is configured to detect a program fail position from a result of the comparator, and a repair circuit that is configured to repair the first LSB data in accordance with the detected fail position and to store the repaired first LSB data in the backup memory, wherein the memory controller is configured to reprogram a new page of the user block with the repaired first LSB data, which is stored in the backup memory, and the first MSB data stored in the buffer memory.

BRIEF DESCRIPTION OF THE DRAWINGS

Other features of the present invention will be more readily understood from the following detailed description of exemplary embodiments thereof when read in conjunction with the accompanying drawings, in which.

DETAILED DESCRIPTION

Figure 1:
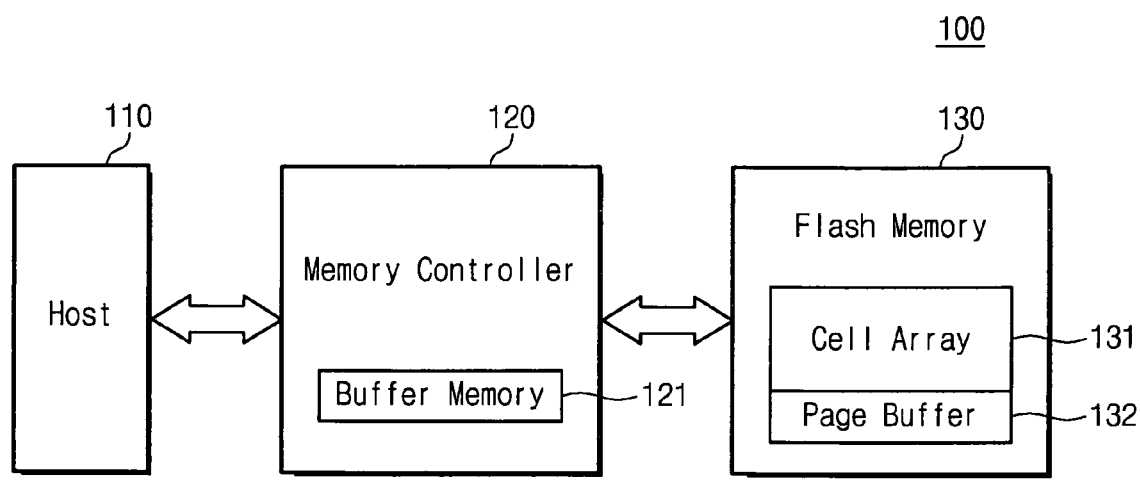
FIG. 1 is a block diagram of a conventional memory system.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the description of the figures.

It will be understood that when an element is referred to as being "connected" or "coupled" to another element, it can be directly connected or coupled to the other element or intervening elements may be present. In contrast, when an element is referred to as being "directly connected or coupled" to another element, there are no intervening elements present. Furthermore, "connected" or "coupled" as used herein may include wirelessly connected or coupled. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first component could be termed a second component, and, similarly, a second component could be termed a first component without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 3:
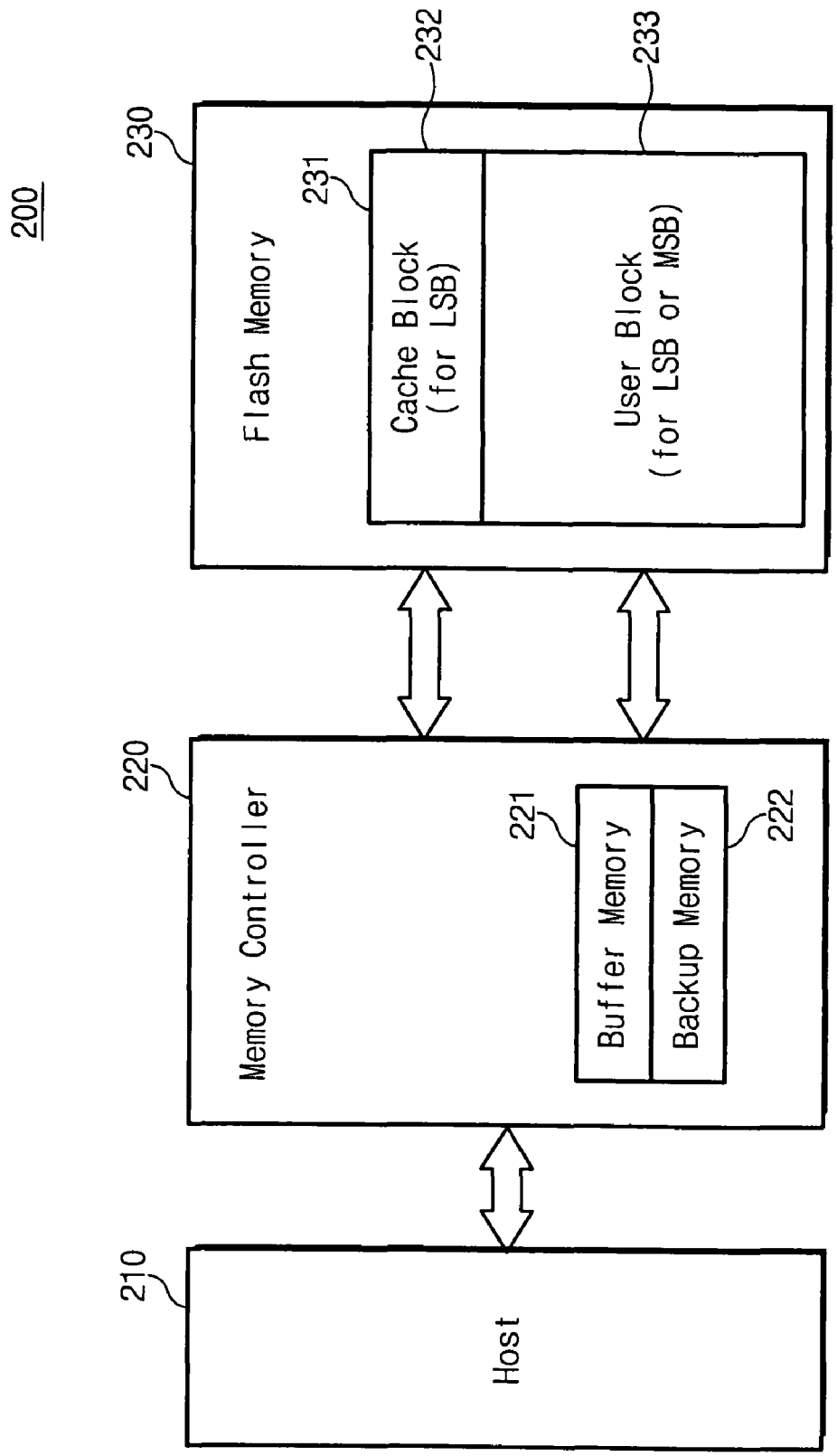
FIG. 3 is a block diagram of a memory system according to some embodiments of the present invention.

FIG. 3 is a block diagram of a memory system 200 according to some embodiments of the present invention. Referring to FIG. 3, the memory system 200 comprises a host 210, a memory controller 220, and a flash memory 230. The flash memory 230 is able to store multi-bit data into a unit memory cell. In the memory system 200 embodiments of the present invention, a programming method is different in a cache block 232 than it is in a user block 233. For the cache block 232, the memory system 200 programs an LSB only. For the user block 233, the memory system first programs an LSB and then programs an MSB. The cache and user blocks, 232 and 233, will be described hereinafter.

As illustrated in FIG. 3, the memory controller 220 and the flash memory 230 may be included in a single memory card. This memory card may be a MultiMedia Card (MMC), a Secure Digital (SD) card, an eXtreme Digital (XD) card, a CompactFlash (CF) card, and/or a subscriber identification module (SIM) card. The memory card is used in connection with the host 210, such as a personal computer, a notebook or laptop computer, a mobile phone, an MP3 player, and/or a portable multimedia player (PMP).

The memory controller 220 receives a command from the host 210 and controls general functions (e.g., writing and reading operations) of the flash memory 230 in compliance with the input command. Referring to FIG. 3, the memory controller 220 includes a buffer memory 221 and a backup memory 222.

The buffer memory 221 is used to store data to be written into the flash memory 230 or data read from the flash memory 230. Data stored in the buffer memory 221 are transferred to the flash memory 230 or the host 210 by the memory controller 220. The buffer memory 221 may be implemented as a random access memory (RAM), e.g., a static or dynamic RAM.

The memory system 200 according to some embodiments of the present invention includes a backup memory 222 in the memory controller 220. The backup memory 222 is used for programming multi-bit data into the flash memory 230.

An MSB is programmed after programming an LSB into the user block 233 of the flash memory 230. But, an LSB may be damaged while programming an MSB into the flash memory 230 that has been already programmed with the LSB. In other words, if there is a program failure during a procedure of programming an MSB, an LSB previously written therein would be lost. To address this problem, the backup memory 222 backups an LSB, which is stored in the flash memory 230, before programming an MSB in accordance with some embodiments of the present invention.

The backup memory 222 may be implemented in a random access memory (RAM), such as the buffer memory 221. In FIG. 3, whereas the buffer memory 221 and the backup memory 222 are different from each other, embodiments of the present invention are not restricted thereto. The buffer memory 221 and the backup memory 22 may be used in a single memory structure in other embodiments. Namely, it is permissible to organize a single RAM in a structure having a buffer field for temporarily storing data and a backup field for backing-up an LSB.

Returning to FIG. 3, the flash memory 230 includes a memory cell array 231. The memory cell array 231 includes the cache block 232 and the user block 233.

The cache block 232 is programmed only with single-bit data. The cache block 232 stores control data of the flash memory 230. This control data contains information relevant to address mapping of flash translation layer (FTL).

The FTL conducts various functions for managing the flash memory, e.g., address mapping by which logical addresses are converted into physical addresses, data transformation for necessity, bad block management during activation, and endurance management. The FTL allocates log blocks in free blocks by using a log scheme during a programming operation and programs the log blocks. If there is no log block or free block, a merging operation is carried out to secure free blocks. Here, the merging operation means a function of, after organizing a data block by copying recently valid data into a new free block from a data block and a previously allocated log block, composing a free block from the log block and the previous data block having the copied data. If a free block is secured by the procedure of merging, the free block is allocated to a log block and then requested data or an erasure mark is programmed into the log block.

In the meantime, the cache block 232 may even store user data with a high frequency of use (hereinafter, referred to as 'high use-frequency data'). Thus, it raises the integrity of high use-frequency data up to a degree of SLC.

The cache block is a general memory block. This memory block comprises pluralities of pages (e.g., 32 or 64 pages). Each page comprises pluralities of memory cells (e.g., 512 or 2K Bytes) sharing a single word line WL. A word line may be coupled to pluralities of pages. In a NAND flash memory, an erasing operation is carried out in the unit of a memory block, while reading and programming operations are carried out in the unit of a page.

Figure 2:
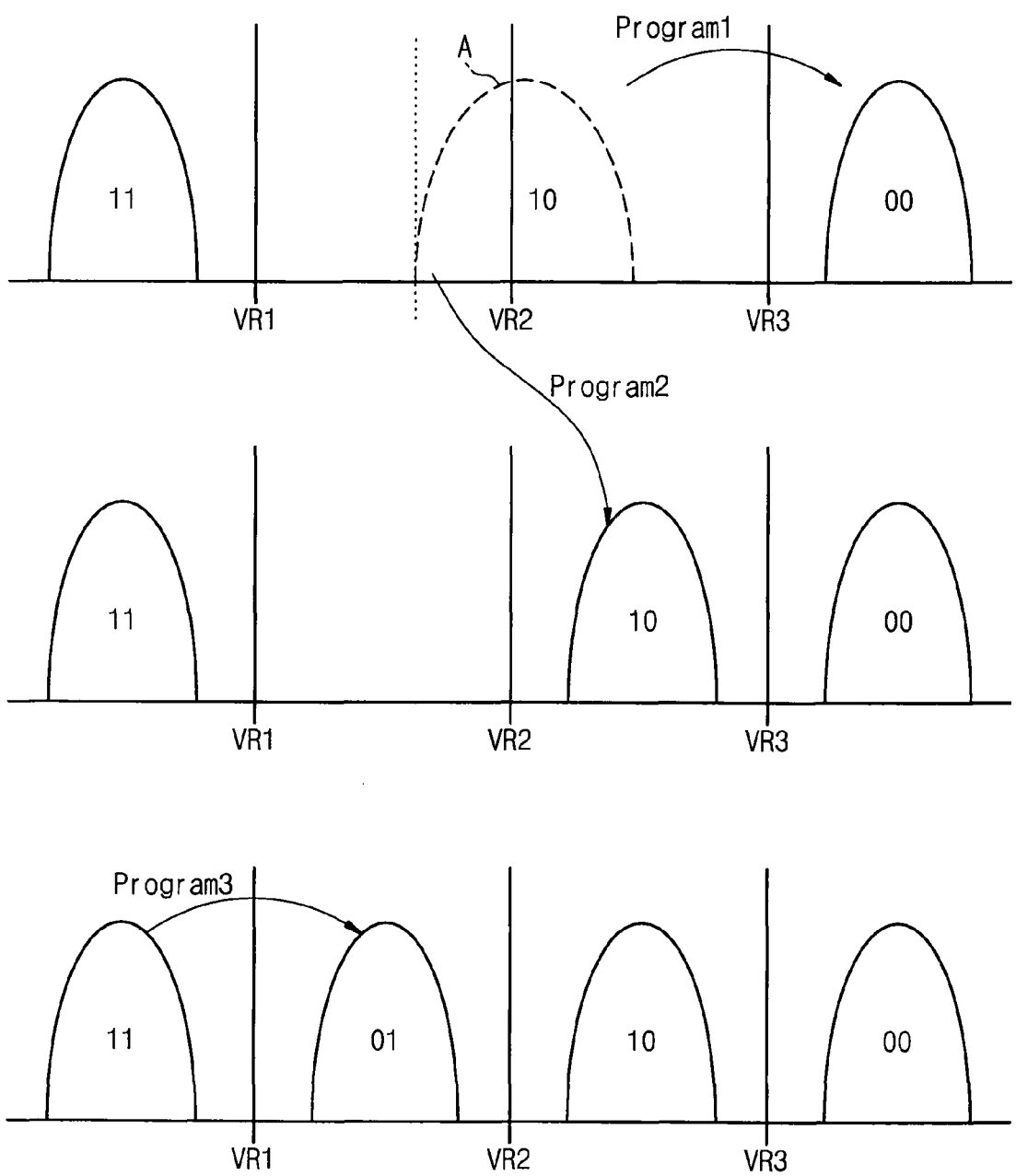
FIG. 2 shows a conventional procedure of programming 2-bit data, i.e., least and most significant bits LSB and MSB, in a unit memory cell.

Meanwhile, each memory cell is able to store multi-bit data (e.g., 2 bits). Namely, as described with reference to FIG. 2, each memory cell has one of four states or levels in accordance with the threshold voltage distribution. Referring to FIG. 2, each memory cell is conditioned in one of the four states '11', '01', '10', and '00'. In the four states, LSBs are '1', '1', '0', and '0' and MSBs are '1', '0', '1', and '0'.

The user block 233 is also a general memory block. The user block 233 is programmed with an MSB after an LSB is programmed therein. The memory controller 2 determines which field is assigned to the cache block 232 or the user block 233 in the memory cell array 231. Meanwhile, the user block 233 can be programmed with an LSB after being programmed with an MSB. The memory controller 210 is able to change a page (not shown), which stores data with high use-frequency data, into the cache block 232 according to circumstances during an operation. For this change, the memory controller 210 includes firmware (not shown) therein.

Before programming an MSB in the user block 233, an LSB is stored in the backup memory 222. If the MSB has been normally programmed in the memory cell array 231, the LSB is erased from the backup memory 222.

But an LSB may be damaged if an MSB has not been normally programmed in the user block 233. In this case, a page (not shown) including a program-failed memory cell is treated as a bad page.

Then, a new page is programmed with an LSB, which is stored in the backup memory 222, and an MSB stored in the buffer memory 223.

The memory system 200 according to some embodiments of the present invention comprises the backup memory 222 in the memory controller 220. The flash memory 230 includes the cache block 232 and the user block 233. The cache block 232 of the present invention is programmed only with an LSB. Thereby, it is possible for the cache block 232 to be secured in data integrity on the level of SLC. In the meantime, the user block 233 of some embodiments of the present invention is able to prevent or reduce loss of LSB and manage an LSB in safety when multi-bit data are programmed therein.

Figure 4:
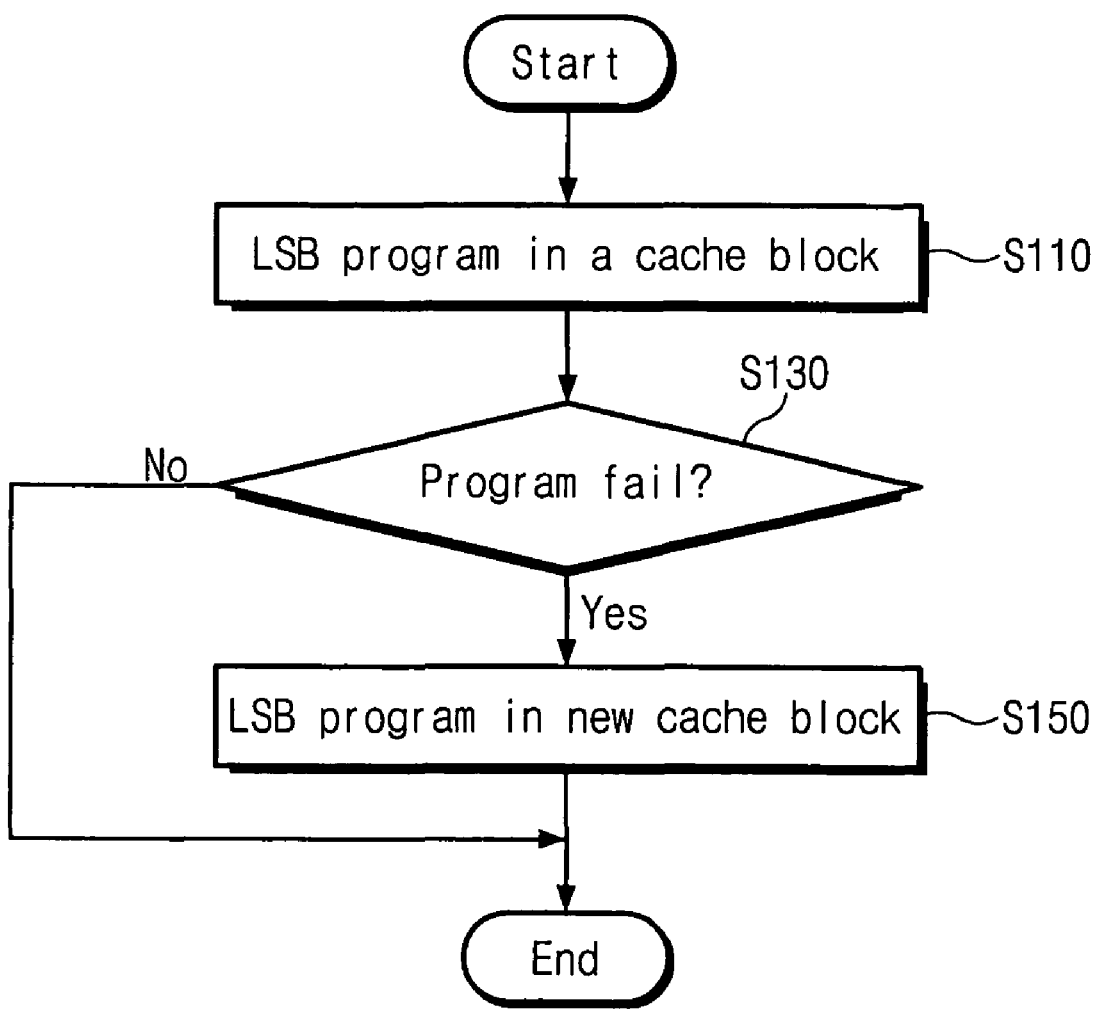
FIG. 4 is a flow chart that illustrates programming data in a cache block shown in FIG. 3 according to some embodiments of the present invention.

FIG. 4 is a flow cart of programming data in the cache block 232 shown in FIG. 3 according to some embodiments of the present invention. Referring to FIGS. 3 and 4, operations of programming data in the cache block 232 will now be described.

First, in block S110, LSB data is programmed into the cache block 232. The memory controller 220 generates control data for controlling the flash memory 200. The control data is generated from firmware (not shown) of the memory controller 220. Meanwhile, the memory controller 220 is able to read data that contains high use-frequency data.

The generated data is stored in the buffer memory 221. The memory controller 220 programs LSB data, which is stored in the buffer memory 221, into a corresponding page of the cache block 232.

Next, in block S130, a determination is made whether there is a program fail on the LSB data stored in the corresponding page of the flash memory 200. If there is no program fail, the programming procedure is terminated. If there is a program fail, the procedure goes to a block S150. During this operation, a page where a program fail occurs is treated as a bad page.

In block S150, the memory controller 220 programs a new page (not shown) with LSB data, which is stored in the buffer memory 221. Thereafter, a program fail in control data stored in the new page of the flash memory 200 is found. Programming the cache block 232, according to some embodiments of the present invention, is accomplished by repeating the aforementioned operations.

Programming the cache block 232 is carried out only with LSB data, so the cache block 232 may secure data integrity on an SLC level.

Figure 5:
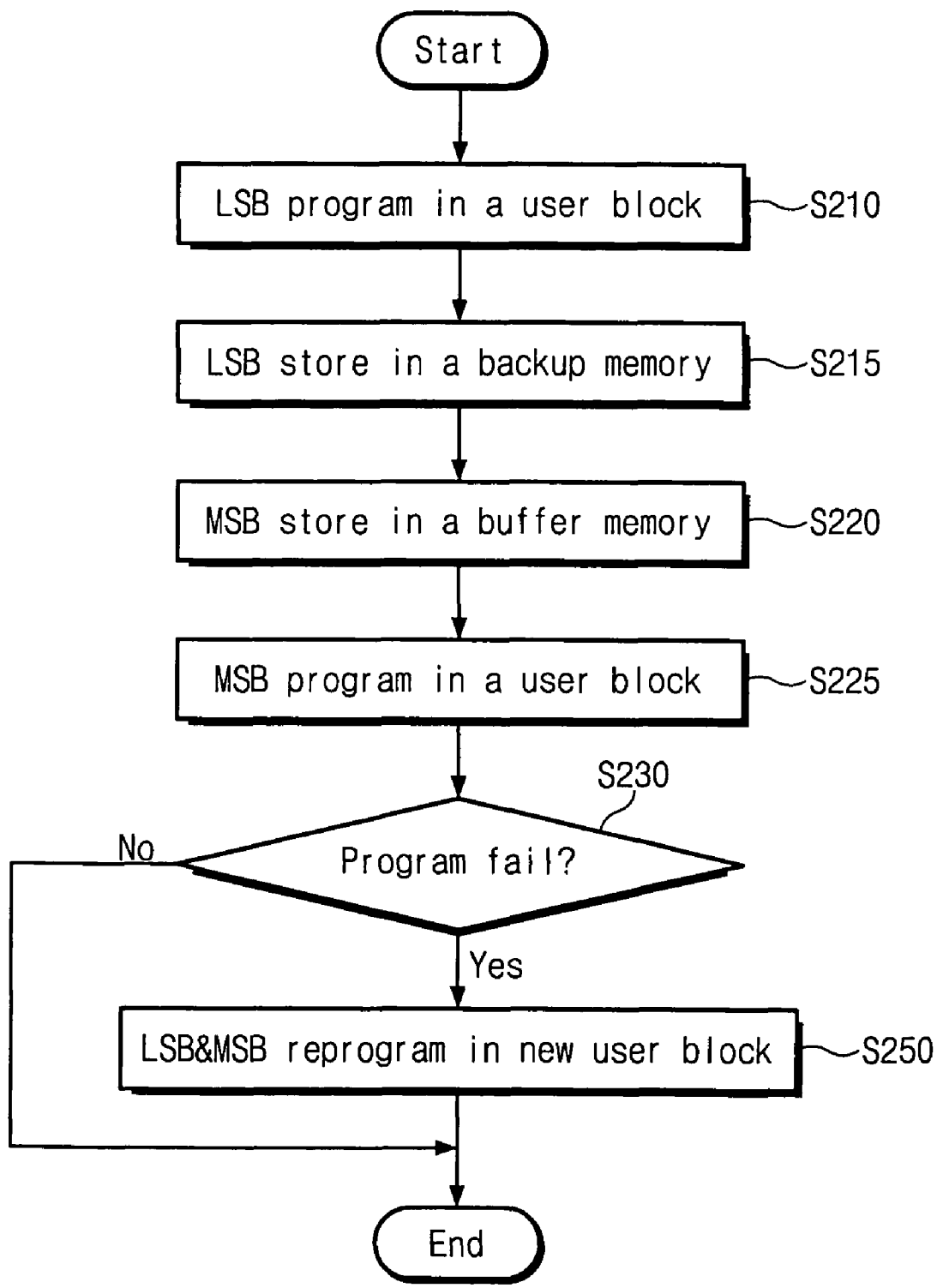
FIG. 5 is a flow chart that illustrates programming data in a user block shown in FIG. 3 according to some embodiments of the present invention.

FIG. 5 is a flow chart of programming data in the user block 233 shown in FIG. 3 according to some embodiments of the present invention. Referring to FIGS. 3 and 5, programming of the user block 233 will now be described.

First, in block S210, LSB data is programmed into the user block 233. The host 210 transfers a command and data to the memory controller 220 to program data into the user block 233 of the flash memory 230. The memory controller 220 operates to control the flash memory 230 in accordance with a command and data corresponding thereto. The memory controller 220 first stores the LSB data, which is to be programmed into an LSB block, in the buffer memory 221. The memory controller 220 programs the LSB data into a page of the user block 233.

Next, in block S215, the LSB data is reserved in the backup memory 232. To ensure data integrity, the memory controller 220 reads the LSB data from its corresponding page and stores the read LSB into the backup memory 232.

Then, in block S220, MSB data is stored in the buffer memory 231. After block S215, the memory controller 220 stores the MSB data to be programmed in a page into the buffer memory 221.

In block S225, the memory controller 220 programs the page of the user block 233 with the MSB data stored in the buffer memory 221.

In block S230, after programming the MSB data, the flash memory determines whether there is a program fail. If there is no program fail, the programming procedure is terminated. Here, a page with a program fail is treated as a bad page.

Next, in block S250, the memory controller 220 programs a new page with the LSB data stored in the backup memory 222 it there is a program fail. The MSB data stored in the buffer memory 221 is also programmed in the new page.

Figure 6:
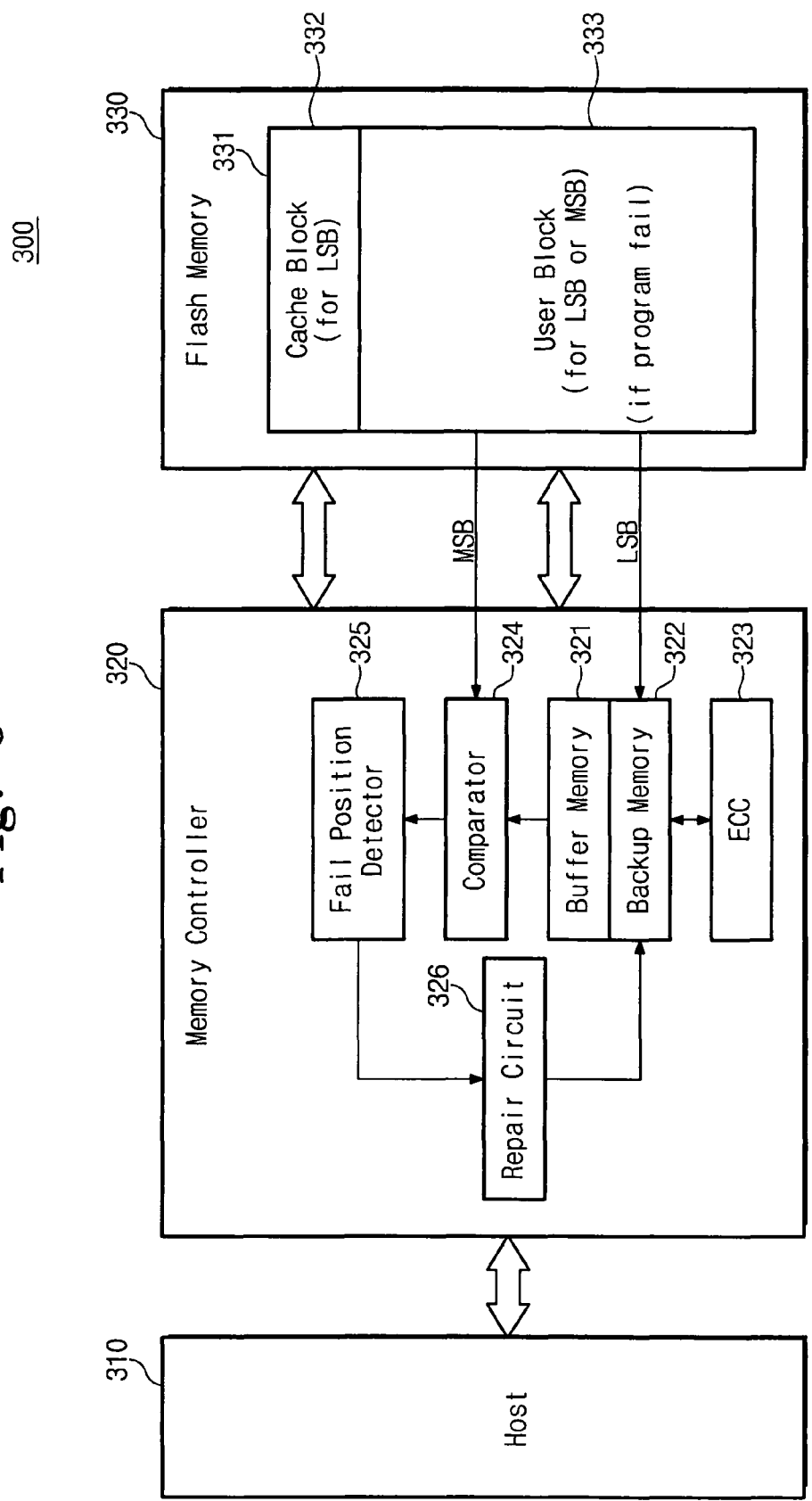
FIG. 6 is a block diagram of a memory system according to further embodiments of the present invention.

FIG. 6 is a block diagram of a memory system 300 according to further embodiments of the present invention. Referring to FIG. 6, the memory system 300 comprises a host 310, a memory controller 320, and a flash memory 330.

The memory controller 320 receives a command from the host 310 and controls general functions (e.g., writing and reading operations) of the flash memory 330 in compliance with the input command. Referring to FIG. 6, the memory controller 320 includes a buffer memory 321, a backup memory 322, an error check/correction (ECC) circuit 323, a comparator 324, a fail position detector 325, a repair circuit 326, and a firmware circuit 327.

The buffer memory 321 is used to store data to be written into the flash memory 330 or data read from the flash memory 330. Data stored in the buffer memory 321 are transferred to the flash memory 330 or the host 310 by the memory controller 320.

The backup memory 322 is used to store LSB data when there is a fail while programming MSB data in the user block 333. In writing MSB data into a page (not shown) of the user block 333 in which LSB data is programmed, the LSB data may be damaged thereby. Namely, if a program fail occurs while programming MSB data, LSB data previously programmed may also be lost. The memory system 300 according to some embodiments of the present invention may be able to repair LSB data that has been lost. The backup memory 322 is used to store the repaired LSB data.

While the buffer memory 321 and the backup memory 322 are shown as separate from each other, those memories may be unified into a single memory component. Namely, a single random access memory (RAM) may include both the buffer memory and the backup memory.

The ECC circuit 323 is used to correct a bit error. For instance, a 4-bit/512-byte ECC circuit may be able to correct 4 error bits every 512 bytes. In this case, it is possible to correct defective data when there are errors generated that are less than 4 bits among 512 bytes.

When there is a fail while programming MSB data in the user block, the ECC circuit 323 operates to correct defective LSB data. The corrected LSB data is stored in the backup memory 322. But, if there are generated errors more than 4 bits in the case that the ECC circuit 323 is a 4-bit/512-byte ECC circuit, the ECC circuit 323 is unable to correct the defective LSB data. According to some embodiments of the memory system 320, even the LSB data can be repaired.

If there is a fail while programming MSB data in the user block 333, then the comparator 324 compares MSB data (hereinafter, 'flash MSB data'), which is read from the user block 333, with MSB data (hereinafter, 'buffer MSB data') stored in the buffer memory 321. Namely, the comparator 324 operates to compare flash MSB data with buffer MSB data bit by bit, and then provides a comparison result to the fail position detector 325.

The fail position detector 325 receives a comparison result from the comparator 324 and detects a fail position. The fail position detector 325 stores an address of the flash memory 330 in correspondence with the detected fail position. The fail position detector 325 provides the fail position to the repair circuit 326.

The repair circuit 326 operates to repair an LSB corresponding to the fail position. LSB data damaged when there is a program fail on MSB data is stored in the backup memory 322. Here, the defective LSB data includes data that has not been corrected by the ECC circuit 323.

Returning to FIG. 6, the flash memory 330 comprises a cell array 331. The cell array 331 includes a cache block 332 that stores LSB data and a user block 333 that stores LSB or MSB data.

The memory system 300, according to some embodiments of the present invention, when there is a program fail while programming MSB data into the user block 333, detects a fail position from comparing flash MSB data with buffer MSB data, and then repairs LSB data located at the fail position. The memory system 300 according to some embodiments of the present invention backs up and repairs LSB data only when there is a fail while programming MSB data in the user block 333.

Thus, the memory system 300 shown in FIG. 6 may be advantageous to remarkably reduce the whole program time, as compared to the memory system 200 shown in FIGS. 3 and 5, because LSB data is not always backed up before programming MSB data in the user block 333.

Further, the memory system 300 shown in FIG. 6 may be able to completely repair defective LSB data by means of the ECC circuit 323 and the MSB comparator 324.

In the meantime, a memory block including a program-failed memory cell is treated as a bad block. Then, LSB data stored in the backup memory 322 is programmed in another memory block. MSB data stored in the buffer memory 321 is programmed in the memory block. Operations of treating a bad block and reprogramming with another memory block are similar to those described above with reference to FIGS. 3 and 4.

Figure 7:
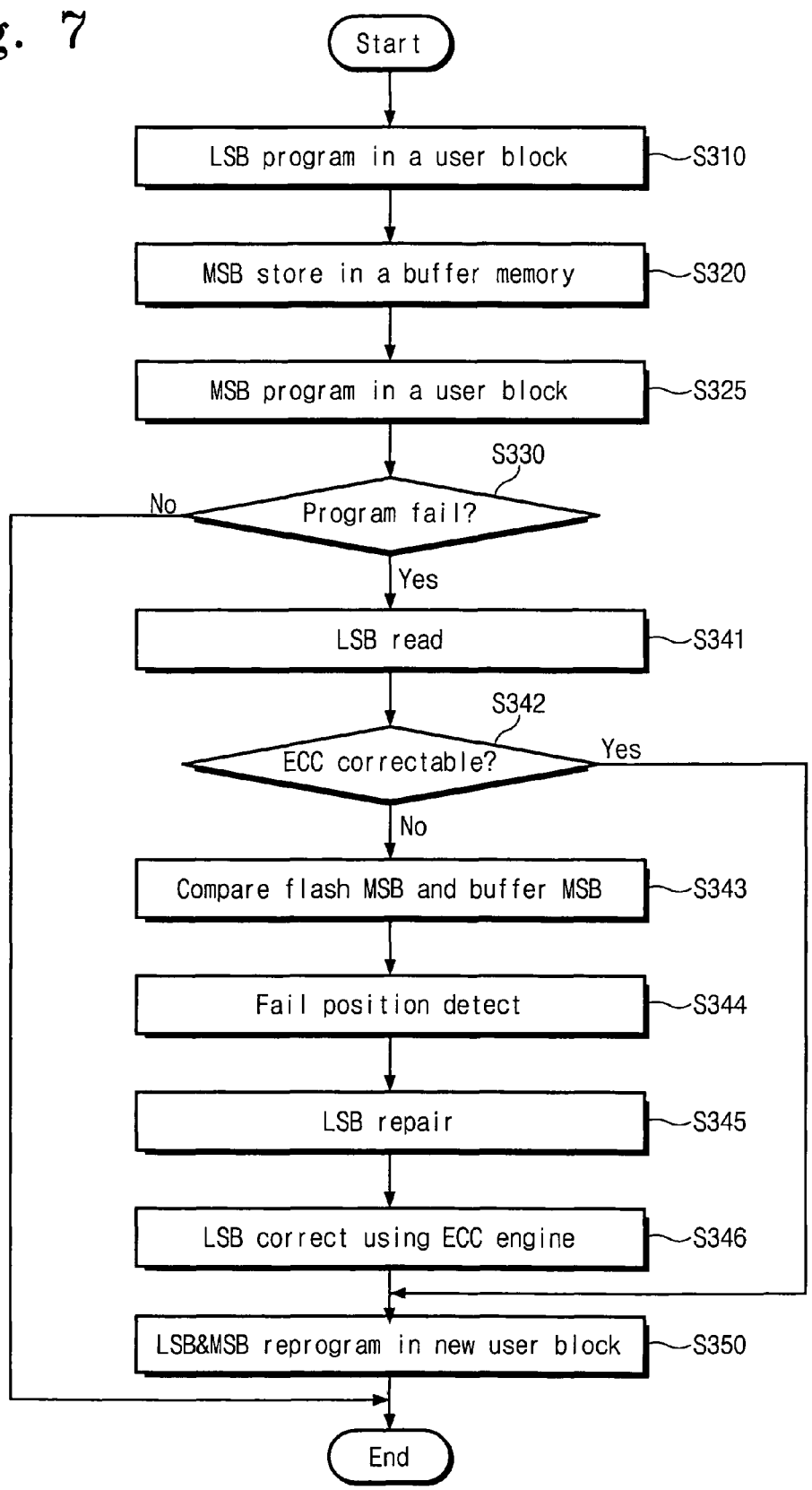
FIG. 7 is a flow chart that illustrates programming data in a user block shown in FIG. 6 in accordance with some embodiments of the present invention.

FIG. 7 is a flow chart for programming data in the user block 333 shown in FIG. 6 according to some embodiments of the present invention. Referring to FIGS. 6 and 7, programming data in the user block 333 will now be described.

First, in block S310, the memory controller 320 programs LSB data into a corresponding page of the user block 333. During this operation, it is proper that operations of program-verification and correction are carried out.

Then, in block S320, the memory controller 320 stores MSB data, which is to be programmed, in the buffer memory 322.

In block S325, the memory controller 320 programs the corresponding page of the user block 333 with the MSB data stored in the buffer memory 322. Here, a page is physically identical to a page programmed with LSB data. An MSB page is physically the same as an LSB page, but different from the LSB page in address. The memory controller 320 receives a logical block from the host 310 and functions to convert the logical block into a physical block.

Next, in block S330, the flash memory 330 determines there is a program fail. In other words, the flash memory 330 determines whether multi-bit data has been normally programmed. If there is no program fail, the programming procedure is terminated. But, if there is a program fail, the procedure goes to block S341.

In block S341, the memory controller 320 reads the LSB data from the corresponding page. The read LSB data is stored in the backup memory 322.

Next, in block S342, the ECC circuit 323 determines whether the LSB data stored in the backup memory 322 is repairable. If the LSB data is repairable, the defective LSB data is corrected and then stored in the backup memory 322. Thereafter, the procedure goes to block S350. If the LSB data stored in the backup memory 322 is not repairable, block S343 is carried out.

In block S343, the comparator 324 operates to compare flash MSB data, which is provided from the user block 333, with buffer MSB data provided from the buffer memory 321.

Next, in block S344, the fail position detector 325 operates to detect a position where a program fail occurs.

Then, in block S345, the repair circuit 326 operates to repair the LSB data in accordance with the fail position detected through block S344. The repaired LSB data is transferred to the backup memory 322.

Thereafter, in block S346, the ECC circuit 323 determines whether there is an error on the repaired LSB data finally stored in the backup memory 322. If there is an error, the ECC circuit 323 corrects the error.

And finally, the memory controller 320 reprograms another memory block of the user block 333 with the LSB data, which is stored in the backup memory 331, and the MSB data stored in the buffer memory 322.

As discussed above, the programming operation to the user block 333 is carried out by backing up LSB data only when there is an MSB program fail and repairing defective LSB data.

The memory system according to some embodiments of the present invention comprises a cache block for programming only an LSB to control data and high use-frequency data. Thus, the memory system may be able to secure data integrity on the SLC level.

The memory system according to some embodiments of the present invention comprises a user block that backs up LSB data while programming MSB data and thereby repairs the LSB data even when it is damaged while programming the MSB data. Therefore, some embodiments of the present invention may address a problem of data loss with LSB data during a programming operation in an MLC flash memory.

As described above, some embodiments of the present invention provide a memory system having an MLC flash memory and programming method thereof that advantageously include a cache block for programming only LSB data, thereby improving data integrity of control data.

Moreover, some embodiments of the present invention provide a memory system having an MLC flash memory and programming method thereof that advantageously include a backup memory for backing up LSB data while programming MSB data, thereby repairing damaged LSB data.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

That which is claimed:

1. A method of programming a multilevel cell flash memory, comprising:
   dividing a memory cell array of the flash memory into a user block and a cache block;
   programming first LSB data into a page of the user block;
   programming first MSB data into the page of the user block after programming the first LSB data;
   programming second LSB data into a page of the cache block; and
   storing control data for controlling the flash memory in the cache block.

2. The programming method as set forth in claim 1, further comprising:
   backing up the first LSB data before programming the first MSB data.

3. The programming method as set forth in claim 2, further comprising:
   detecting a program fail from the page of the user block after programming the first MSB data.

4. The programming method as set forth in claim 3, further comprising:
   reprogramming the first LSB data and the second MSB data into a new page of the user block responsive to detecting the program fail.

5. The programming method as set forth in claim 1, further comprising:
   detecting a program fail from the page of the cache block after programming the second LSB data.

6. The programming method as set forth in claim 5, further comprising:
   reprogramming the second LSB data into a new page of the cache block responsive to detecting the program fail.

7. The programming method as set forth in claim 1, wherein the cache block stores high use-frequency data among data stored in the user block.

8. The programming method as set forth in claim 1, further comprising:
   detecting a program fail from the page of the user block after programming the first MSB data.

9. The programming method as set forth in claim 8, further comprising:
   repairing the first LSB data responsive to detecting the program fail.

10. The programming method as set forth in claim 9, wherein repairing the first LSB data comprises:
    reading the first LSB data from the page of the user block;
    determining whether the first LSB data is correctable by an error correction code; and
    reprogramming the first LSB data and the first MSB data into a new page of the user block responsive to determining that the first LSB data is correctable by the error correction code.

11. The programming method as set forth in claim 10, further comprising:
    detecting a fail position based on the first MSB data if the first LSB data is not correctable using the error correction code.

12. The programming method as set forth in claim 11, further comprising:
    correcting the repaired first LSB data using the error correction code.

13. The programming method as set forth in claim 12, further comprising:
    reprogramming the corrected first LSB data and the first MSB data into the new page of the user block.

14. The programming method as set forth in claim 1, wherein the flash memory is a NAND flash memory.

* * * * *